US007318130B2

(12) United States Patent
Morrow et al.

(10) Patent No.: US 7,318,130 B2
(45) Date of Patent: Jan. 8, 2008

(54) SYSTEM AND METHOD FOR THERMAL THROTTLING OF MEMORY MODULES

(75) Inventors: Warren R. Morrow, Steilacoom, WA (US); Eric J. Dahlen, Sherwood, OR (US); Raman Nayyar, Hillsboro, OR (US); Jayamohan Dharanipathi, Hillsboro, OR (US); Howard David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 10/881,727

(22) Filed: Jun. 29, 2004

(65) Prior Publication Data

US 2005/0289292 A1    Dec. 29, 2005

(51) Int. Cl.
*G06F 12/00* (2006.01)
(52) U.S. Cl. ...................... 711/154; 711/100
(58) Field of Classification Search ........... 711/154, 711/167, 105, 133, 145; 713/1; 365/189.05, 365/189.01
See application file for complete search history.

(56) References Cited

U.S. PATENT DOCUMENTS

| | | | | |
|---|---|---|---|---|
| 5,388,075 | A * | 2/1995 | Vinal | 365/189.05 |
| 5,424,980 | A * | 6/1995 | Vinal | 365/189.01 |
| 5,907,487 | A * | 5/1999 | Rosenberg et al. | 700/85 |
| 5,920,685 | A * | 7/1999 | Romano et al. | 358/1.15 |
| 5,953,685 | A | 9/1999 | Bogin et al. | 702/136 |
| 6,173,217 | B1 | 1/2001 | Bogin et al. | 700/299 |
| 6,199,127 | B1 | 3/2001 | Ajanovic | 710/100 |
| 6,260,127 | B1 * | 7/2001 | Olarig et al. | 711/167 |
| 6,343,085 | B1 * | 1/2002 | Krishnan et al. | 370/468 |
| 6,470,238 | B1 | 10/2002 | Nizar et al. | 700/299 |
| 6,507,530 | B1 | 1/2003 | Williams et al. | 365/221 |
| 6,772,352 | B1 | 8/2004 | Williams et al. | 713/300 |
| 2005/0086437 | A1 * | 4/2005 | Modha | 711/133 |

* cited by examiner

*Primary Examiner*—Pierre-Michel Bataille
(74) *Attorney, Agent, or Firm*—Marger Johnson & McCollom, P.C.

(57) ABSTRACT

Some embodiments of the invention accurately account for power dissipation in memory systems that include individual memory modules by keeping track of the number of read requests, the number of write requests, and the number of activate requests that are applied to the individual memory modules during selected time periods. If the sum of these totals exceeds a threshold level, the embodiments throttle the memory system, either by throttling the entire memory system based in response to the most active memory module, or by throttling individual memory modules as needed. Other embodiments of the invention may assign the same or different weights to activate requests, read requests, and write requests. Other embodiments are described and claimed.

24 Claims, 4 Drawing Sheets

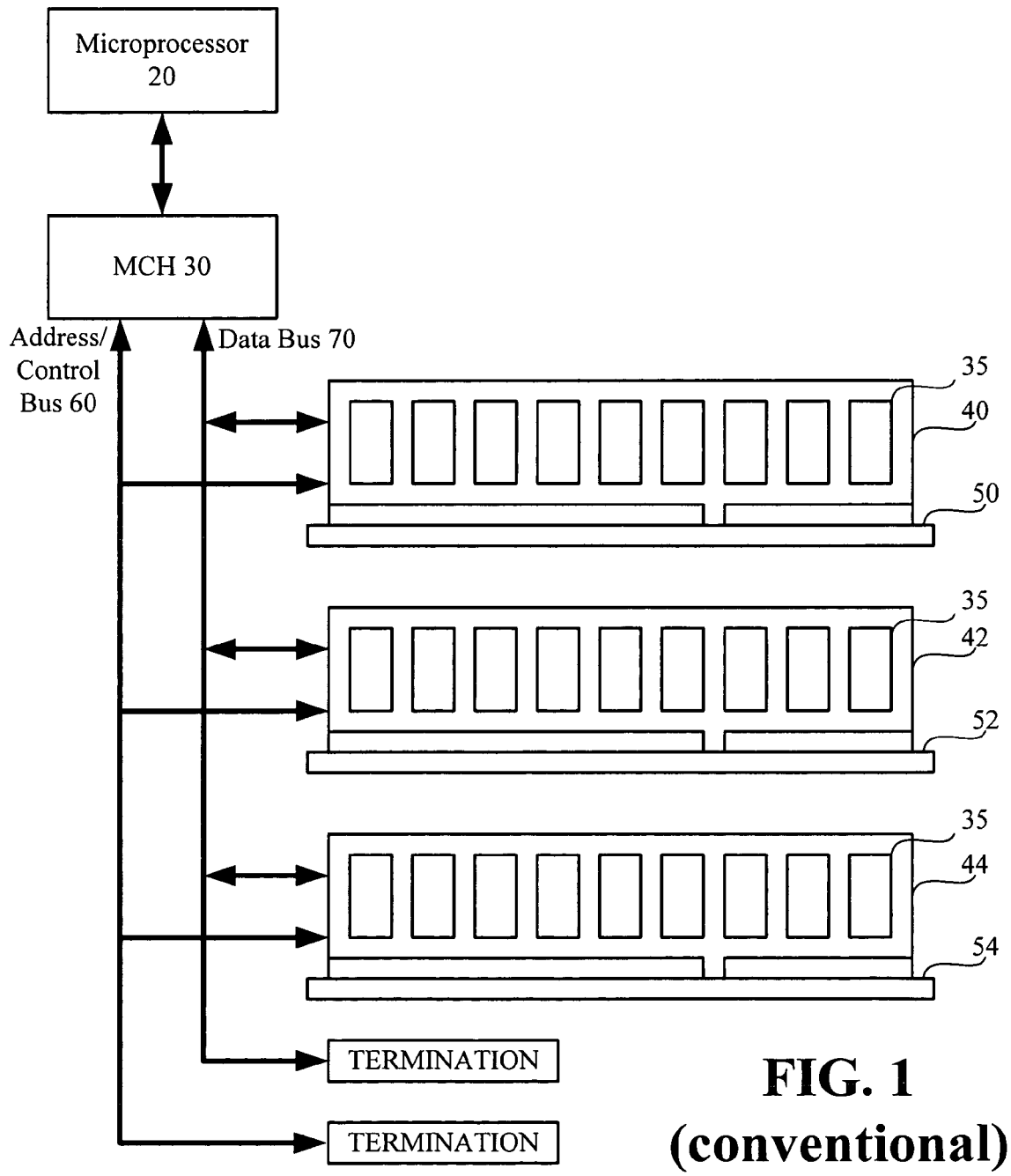
FIG. 1 (conventional)

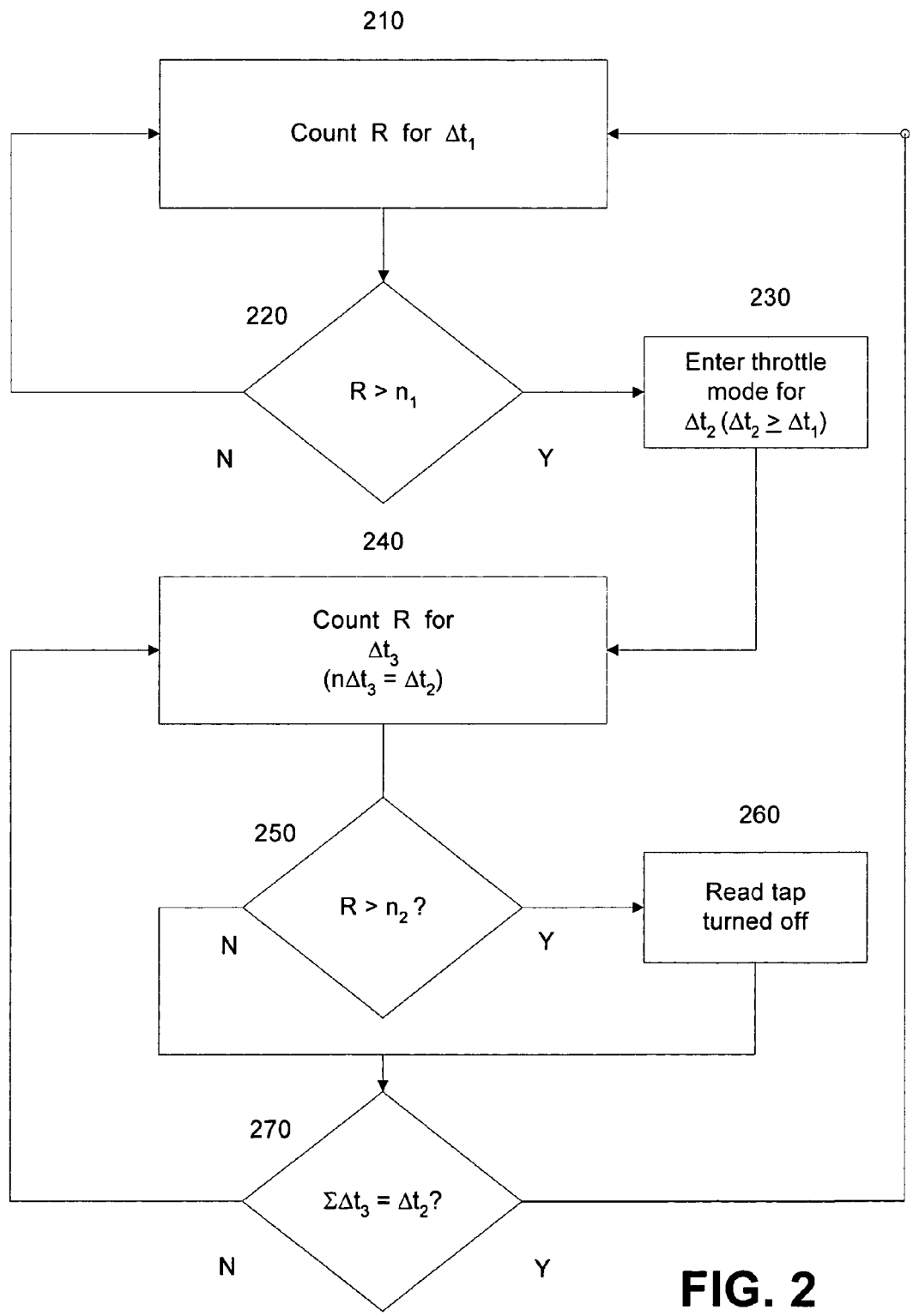
FIG. 2
(conventional)

SYSTEM AND METHOD FOR THERMAL THROTTLING OF MEMORY MODULES

BACKGROUND OF THE INVENTION

Digital processors, such as microprocessors, use a memory subsystem to store data and processor instructions. Some processors communicate directly with memory, and others use a dedicated controller chip, often part of a "chipset," to communicate with memory.

Conventional memory subsystems are often implemented using memory modules. Referring to FIG. 1, which illustrates an example conventional memory subsystem, a microprocessor 20 communicates with a memory controller/hub (MCH) 30 that couples the microprocessor 20 to various peripherals. One of these peripherals is system memory, shown as dual in-line memory modules (DIMMs) 40, 42, and 44 inserted in card slots 50, 52, and 54. In this example, each of the DIMMs 40, 42, 44 includes a number of memory devices 35, which may be DRAM memory devices. When connected, the DIMMs are addressed from MCH 30 whenever MCH 30 asserts appropriate signals on an Address/Control Bus 60. Data transfers between MCH 30 and one of DIMMs 40, 42, and 44 occur on a Data Bus 70.

Thermal throttling refers generally to methods used to reduce the workload experienced by processor-based electronic system components in response to overheating. For example, some processors are equipped with a pin that signals when the processor die temperature has exceeded a threshold level. When the threshold is exceeded, the processor is "throttled" or operated at a slower speed for a period of time in order to reduce the amount of heat generated by the processor.

Memory modules are another type of component that may be found in processor-based electronic systems that may be thermally throttled.

For example, FIG. 2 is a flowchart illustrating a conventional method 200 of thermal throttling that may be applied to the memory subsystem of FIG. 1. In process 210, the MCH 30 counts the number of read requests R that are directed at any of the DRAMs 35 on the DIMMs 40, 42, 44 during a first time period $\Delta t_1$. The first time period $\Delta t_1$ may be referred to as a global sample window (GSW). In process 220, the number of read requests that occur during the GSW is compared to a first preset read threshold n1. If r is less than or equal to n1, process 210 is repeated. If r is greater than n1, a thermal throttling mode is entered at process 230 for a second time period $\Delta t_2$, where $\Delta t_2$ is greater than or equal to the first time period $\Delta t_1$. The second time period $\Delta t_2$ may be referred to as the Read Throttle Period (RTP).

At process 240, the number of read requests occurring during a third time period $\Delta t_3$ is tracked by the MCH 30. The third time period $\Delta t_3$ may be referred to as the Read Monitor Period (RMP). The length of the second time period $\Delta t_2$ (RTP) is n times the length of the third time period $\Delta t_3$ (RMP). In process 250, the number of read requests R is compared to a second preset read threshold n2. If R is greater than n2, process 260 prevents additional read requests from being issued to the memory interface for the rest of the time period $\Delta t_3$ (RMP). Regardless of the outcome of process 250, in process 270 the number of elapsed third time periods $\Delta t_3$ (RMPs) is checked for equality with the second time period $\Delta t_2$ (RTP). If the RTP has not expired, a return to process 240 occurs and the number of reads is checked for another RMP. If the RTP has expired, then the throttling mode also expires and a return to process 210 occurs.

In the above example, write requests that are directed at DRAMs 35 on the DIMMs 40, 42, 44 are handled in an identical manner, but using a separate mechanism. Thus, the thermal throttling mode could be triggered either by the number of read requests or the number of write requests exceeding a threshold level.

In the example described above, all reads and writes are treated identically, and no distinction is made based upon which individual DIMM 40, 42, 44 contains the DRAM 35 that is the target of the memory transaction. This approach works well for desktop systems because it successfully accounts for the total dissipated power (TDP) during read and write cycles for the entire memory subsystem. However, contemporary server systems can dissipate more heat compared to desktop systems and the primary thermal concern is the thermal density for individual memory modules. Also, compared to desktop traffic, server traffic is generally more random and spread across various memory modules as compared to desktop traffic.

Thus, if one assumes that that reads are well-distributed across all the memory modules in a server system (a fairly safe assumption), the result will be a threshold that is set too high. In such situations, the memory system might become vulnerable to damage by a power virus, which is a virus designed to concentrate memory accesses on one DIMM or even on one DRAM. Power viruses such as these have the potential to destroy the particular memory module that is attacked. Even in the absence of a power virus a "hot spot" can occur under some reasonable workloads, or when memory modules of different size are used.

Conversely, if one assumes that all reads or writes will be targeted to one memory module, the threshold will be set too low and the attainable performance of the system will be constrained due to overly frequent and unnecessary throttling of the memory interface.

Furthermore, while the power dissipated by read and write requests is accounted for by the above example, it fails to recognize the power dissipated during activates on the DRAM interface.

BRIEF DESCRIPTION OF THE DRAWINGS

FIG. 1 is a block diagram illustrating an example conventional memory subsystem.

FIG. 2 is a flowchart illustrating a conventional method of thermal throttling that may be applied to the memory subsystem of FIG. 1.

DETAILED DESCRIPTION OF THE INVENTION

Figure 3:
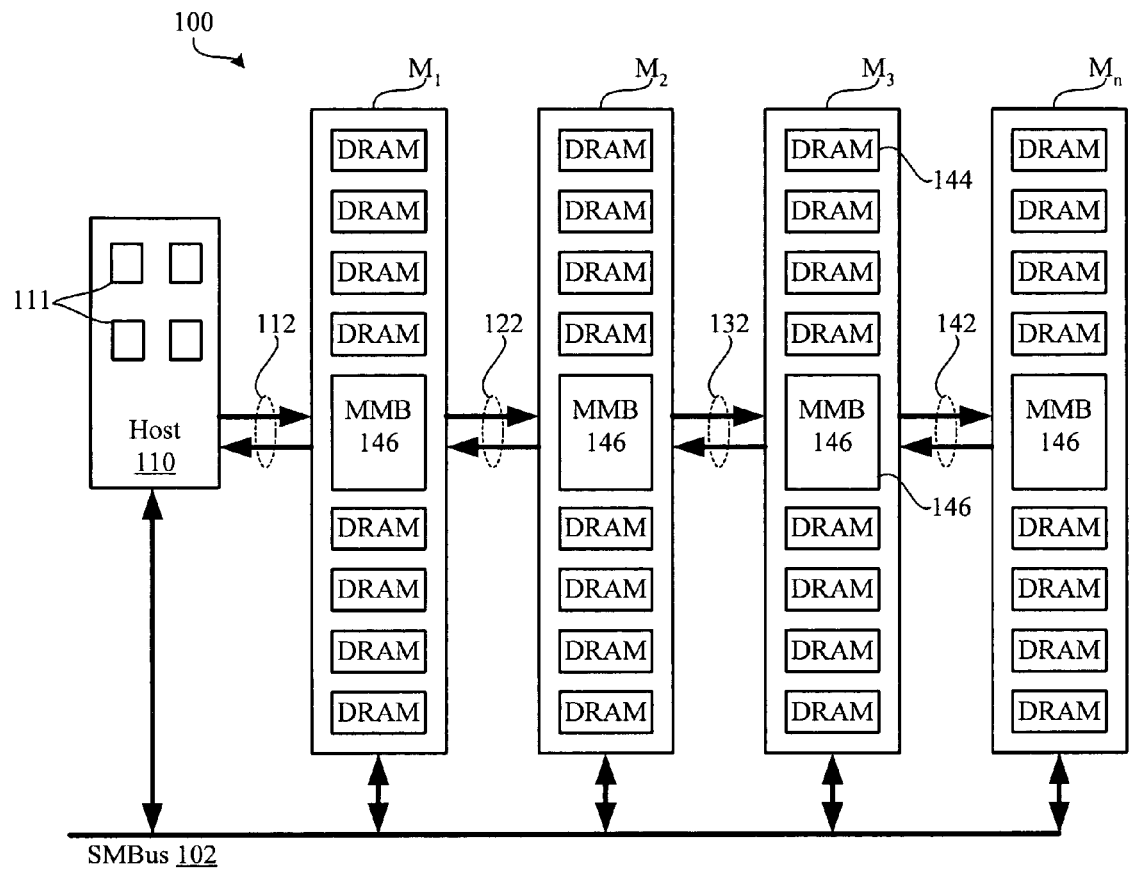
FIG. 3 is a block diagram illustrating an example memory subsystem utilizing memory modules that may be used in conjunction with some embodiments of the invention.

FIG. 3 is a block diagram illustrating some components of an example memory subsystem 100 utilizing DIMMs that may be used in conjunction with embodiments of the invention. It should be emphasized that embodiments of the invention are not limited only to memory subsystems that are implemented with DIMMs. For example, embodiments of the invention work equally well with memory subsystems that utilize single inline memory modules, or SIMMs. Thus, the generic term "memory module" is intended to include DIMMs, SIMMs, and other memory modules that include a plurality of memory devices. The number of memory modules in the memory subsystem may be more or less than the number illustrated in FIG. 3.

Referring to FIG. 3, the memory subsystem 100 includes a host 110, four memory modules M1, M2, M3, and M4, four memory channels 112, 122, 132, and 142, and a low-speed system management bus (SMBus) 160. The host 110 includes four counters 111, each counter corresponding to one of the memory modules M1-M4. Host 110 may also include one or more microprocessors, signal processors, memory controllers, graphics processors, etc. The processors and memory controllers may also be separate from the host, and a memory controller may be included as part of the processor. Typically, a memory controller coordinates access to system RAM memory, and the memory controller is the component of host 110 connected directly to the host memory channel 112, which is connected to the first memory module M1.

Memory module M3 is typical of modules M1-M4. A memory module buffer (MMB) 146 connects module M3 to a host-side (upstream) memory channel 132 and to a downstream memory channel 142. A number of memory devices, for example, Dynamic Random Access Memory chips (DRAMs) 144, communicate with memory module buffer 146 through a memory device bus (not shown in FIG. 2) to provide addressable read/write memory for subsystem 100. Other example memory subsystems compatible with embodiments of the invention need not have memory module buffers.

Figure 4A:
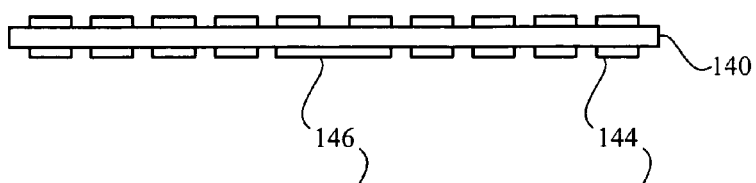
FIGS. 4A and 4B are diagrams that illustrate in further detail the memory modules of FIG. 3.
Figure 4B:
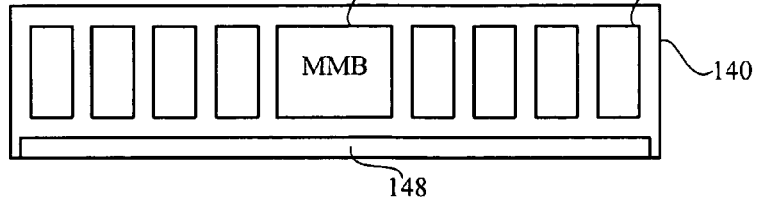

FIGS. 4A and 4B are schematic diagrams that further illustrate the memory modules M1-M4 of FIG. 3. A set of card edge connectors 148 provide electrical connections for upstream and downstream memory channels, reference voltages, clock signals, SMBus 160, etc. In this instance, MMB 146 is centrally located on one side of module M3, flanked on each side by four DRAM devices 144, with ten more DRAM devices 144 occupying the opposite side of module M3.

Each memory channel 112, 122, 132, and 142 in FIG. 3 is a point-to-point connection between two devices, either two MMBs 146 or the host 110 and an MMB 146. The direct connection allows the memory channels to run preferably at relatively high data rates.

Although the memory subsystem 100 of FIG. 3 illustrates only memory modules M1-M4 and a host 110, there may be a repeater (not shown) located between any two of the components illustrated in FIG. 3. For example, a repeater may be placed between the host 110 and the module M1 or between the module M1 and the module M2.

Each of the memory channels 112, 122, 132, and 142 is composed of two uni-directional buses for data traffic in both directions. That is, commands and data can travel in the direction away from the host 110 and status and data can travel towards the host 110. For convenience, the movement of command and data through the memory channels in a direction away from the host 110 will henceforth be referred to as "southbound." Likewise, movement of status and data through the memory channels in the direction toward the host 110 will be referred to "northbound." It should be apparent that these terms have nothing to do with the actual geographic orientation of the memory channels.

The actual signal paths that make up the memory channels are implemented using high-speed serial differential signals. The number of differential signals in the southbound direction may be different than the number of signals in the northbound direction.

In normal mode of operation, host 110 accesses the memory space of module M3 by sending commands and data, addressed to module M3, southbound on host memory channel 112. The MMB 146 of module M1 receives the commands/data and resends it, without modification, on memory channel 122 to the MMB 146 of memory module M2. The MMB 146 of module M2 next receives the command and resends it on memory channel 132 to MMB 146 of memory module M3. On module M3, MMB 146 detects that the command is directed to it, decodes it, and transmits DRAM commands and signaling to the DRAMs (e.g., 144) controlled by that buffer. When a response is expected (such as when a read is requested), MMB 146 receives the data from the DRAMs, encodes/formats the data, and sends it backwards (northbound) along the memory channels 132, 122, and 112, repeated without modification by the MMBs 146 on modules M2 and M1, to host 110.

FIG. 3 also illustrates a control bus (SMBus) 160 routed to the host 110 and to each of the modules M1, M2, M3, and M4. Although proprietary or other standard buses or signaling may be used for other memory module subsystems, an SMBus is illustrated in FIG. 3. A SMBus is a particular type of control bus that conforms to the *System Management Bus (SMBus) Specification*, SBS Implementers Forum, Version 2.0, Aug. 3, 2000. SMBus 160 provides a reliable low-speed (10 to 100 kbps) serial channel that is typically used in a computer system to control peripherals such as a battery management system, fans, laptop display settings, memory module recognition and configuration, etc.

Figure 5:
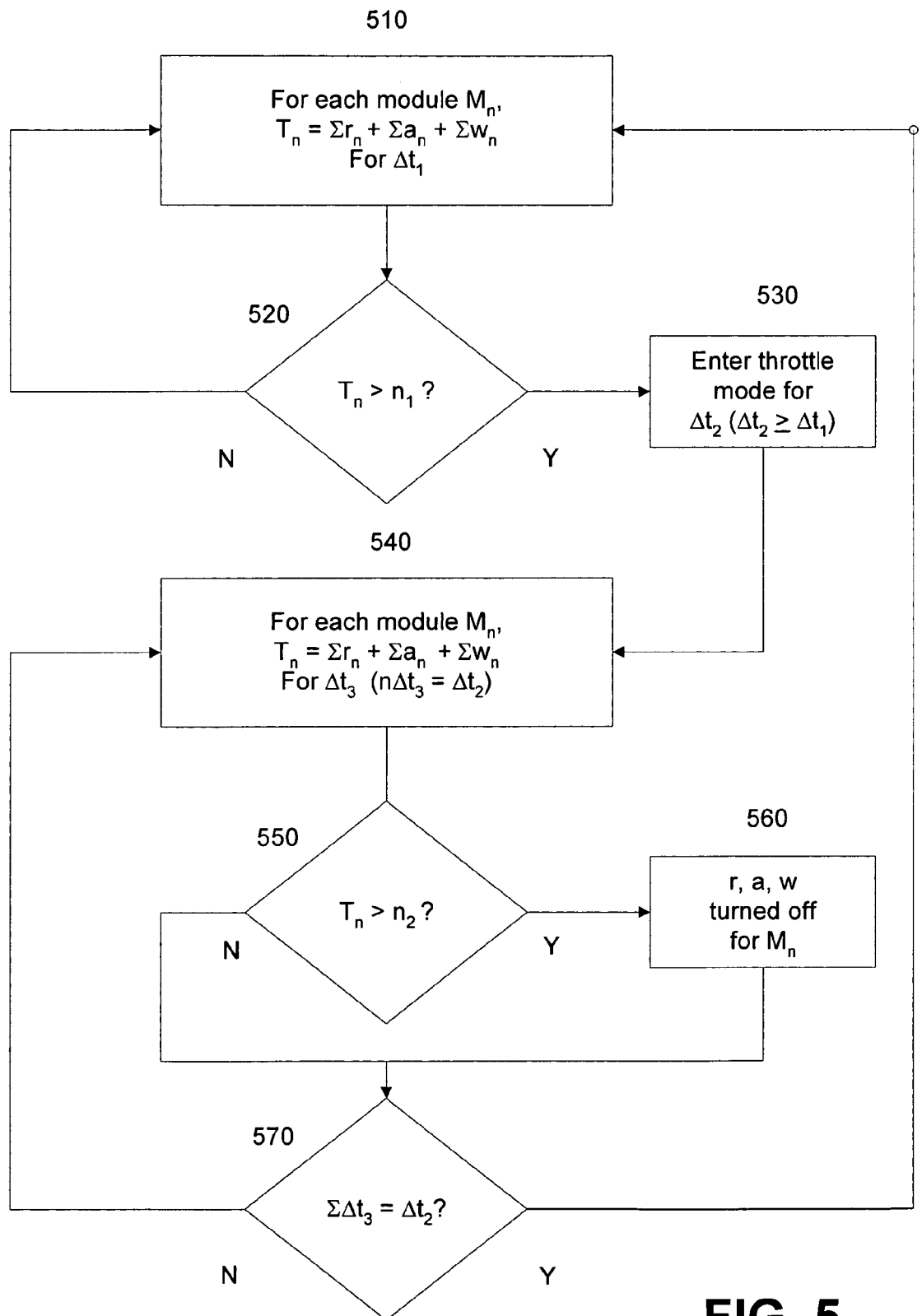
FIG. 5 is a flowchart illustrating a method of thermal throttling according to some embodiments of the invention.

FIG. 5 is a flowchart illustrating a method 500 of thermal throttling according to some embodiments of the invention.

As was explained above, there is a counter 111 corresponding to each of the memory modules M1-M4 in the memory subsystem 100 illustrated in FIG. 3. Process 510 of FIG. 5 generally refers to module Mn so that the method 500 is applicable to any number n of memory modules. Over a first time period $\Delta t_1$, the value Tn in each counter corresponding to the memory module Mn is incremented for every read request (Rn), activate command (An), and write request (Wn) that is directed at the particular memory module Mn. The first time period $\Delta t_1$ may be referred to as a global sample window (GSW).

In process 520, every value Tn corresponding to each of the memory modules Mn is compared with a first threshold value n1. If Tn is not greater than n1, then the counter is reset and process 510 is repeated for another first time period $\Delta t_1$. If Tn is greater than n1, then the corresponding memory module Mn is placed in throttle mode (process 530) for a second time period $\Delta t_2$, where $\Delta t_2$ is greater than or equal to the first time period $\Delta t_1$. The second time period $\Delta t_2$ may be referred to as the Read Throttle Period (RTP).

At process 540, for every module Mn that is in the thermal throttling mode, the total number Tn of read requests (Rn), activate commands (An), and write requests (Wn) occurring is again tracked by the corresponding counter, but this time for a third time period $\Delta t_3$. The length of the second time period $\Delta t_2$ is n times the length of the third time period $\Delta t_3$. The third time period $\Delta t_3$ may be referred to as the Read Monitor Period (RMP).

In process 550, the total number of reads/activates/writes Tn is compared to a second threshold value n2. If Tn is greater than n2, process 560 prevents further read requests, activate commands, or write requests to be issued to the corresponding memory module Mn for the rest of the time period $\Delta t_3$ before moving on to process 570. If Tn is not greater than n2, process 570 will take place immediately after process 550.

In process 570, the number of elapsed third time periods $\Delta t_3$ is checked for equality with the second time period $\Delta t_2$. If the second time period $\Delta t_2$ has not expired, the value of Tn is reset and a return to process 540 occurs, where Tn is again tracked for another third time period $\Delta t_3$. In process 570, if the second time period $\Delta t_2$ has expired, then the throttling mode for the corresponding memory module Mn also expires and a return to process 510 occurs.

Thus, according to the embodiments of the invention described above, a separate counter exists for each memory module, and the counter is incremented for every read, write, or activate cycle that is targeted at the module. Thermal throttling methods can then be applied to individual memory modules that exceed a threshold level. Alternatively, thermal throttling techniques may be applied to all modules once at least one of the memory modules exceeds the threshold level. In this alternative arrangement, the memory module having a corresponding counter with the highest count will effectively determine when the entire memory subsystem enters the thermal throttling mode. In either implementation, the threshold levels may be set between the two extremes so as to protect against a power virus while also ensuring that the performance impact is minimized.

According to some other embodiments of the invention, a programmable instruction weighting may be applied to differentiate between Read/Write commands and Activate commands. Read/write commands targeted at a particular memory module may increment the corresponding counter by a fixed amount but an activate command may increment the counter by an amount specified by a programmable field. For example, a read command or write command targeted at a particular memory module may increment the corresponding counter by 2. However, the amount that the counter is incremented by an activate command may be specified by a programmable two-bit field. When the two-bit field is '00', the activate command will also increment the counter by 2, so that the ratio between activate commands and read/write commands is 2:2. When the two-bit field is '11', the ratio becomes 5:2. By assigning a greater weight to activate commands, the embodiments may effectively account for the increased power dissipation associated with those commands.

According to alternative embodiments of the invention, the weight assigned to each of the three commands may be separately controlled. In the example above, read and write commands were given the same weight. However, according to these alternative embodiments each of the read commands, write commands, and activate commands would increment the corresponding counter by a different amount.

It is also possible that during a given cycle, a read or write could occur to one memory module along with an activate to a different memory module. In this situation, two different counters, each corresponding to one of the modules, would be incremented.

Assuming that a chipset using an embodiment of the invention has two modules on the memory channel, that a memory module dissipates about 20 W of power, and that a server can cool 8 Watts per module under peak theoretical bandwidth conditions, the chipset will be able to operate at approximately 80% of its peak theoretical bandwidth while a conventional chipset that does not utilize module by module thermal throttling will be limited to about 40% of peak.

Embodiments of the invention can achieve the above advantages because they reduce the probability of entering throttle mode. The embodiments also improve the accuracy of monitoring the heat dissipation by taking into account the activate cycles. Compared to the conventional example of thermal throttling described in FIG. 2, embodiments of the invention also simplify the associated logic because one set of counters and associated logic for writes are eliminated.

In high performance servers, both heat dissipation and high performance must be addressed simultaneously. Embodiments of the invention directly address these issues by throttling the memory device interface only when really required, thus allowing it to operate at a higher "sustained" bandwidth than its predecessors. In other words, the throttling mechanism is not allowed to interfere with or limit processor/system performance.

Instead of treating all reads/writes as if they were targeting a single memory module, embodiments of the invention treat accesses to different memory modules separately, thereby reducing the frequency that the memory device interface is throttled. Thus, the system may deliver substantially higher sustained bandwidth in a server environment compared to the conventional thermal throttling techniques.

The preceding embodiments are exemplary. Those of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

Although the specification may refer to "an", "one", "another", or "some" embodiment(s) in several locations, this does not necessarily mean that each such reference is to the same embodiment(s), or that the feature only applies to a single embodiment.

Many of the specific features shown herein are design choices. The number and type of memory modules, the number and type of memory chips on a memory module, control bus protocols, etc., are all merely presented as examples. For instance, memory modules are not required to have memory module buffers as was illustrated in the example above. Likewise, functionality shown embodied in a single integrated circuit or functional block may be implemented using multiple cooperating circuits or blocks, or vice versa. Such minor modifications are encompassed within the embodiments of the invention, and are intended to fall within the scope of the appended claims.

We claim:

1. A method comprising:
   during a first time period, adjusting a first value in a first counter when a read request, a write request, or an activate request is directed at a first memory module; and
   during the first time period, adjusting a second value in a second counter when a read request, a write request, or an activate request is directed at a second memory module,
   wherein changing the value stored in the first counter and the value stored in the second counter comprises:
   changing the value stored in the first counter and the value stored in the second counter by a first amount for each read request;
   changing the value stored in the first counter and the value stored in the second counter by a second amount for every write request; and
   changing the value stored in the first counter and the value stored in the second counter by a third amount for every activate request.

2. A method comprising:
  during a first time period, adjusting a first value in a first counter when a read request, a write request, or an activate request is directed at a first memory module; and
  during the first time period, adjusting a second value in a second counter when a read request, a write request, or an activate request is directed at a second memory module,
  wherein changing the value stored in the first counter and the value stored in the second counter comprises:
    changing the value stored in the first counter and the value stored in the second counter by a first amount for every read request or write request; and
    changing the value stored in the first counter and the value stored in the second counter by a second amount for every active te request.

3. The method of claim 2, further comprising:
  throttling the first memory module for a second time period when the value stored in the first counter reaches a first threshold level.

4. The method of claim 2, further comprising:
  throttling the second memory module for a second time period when the value stored in the first counter reaches a first threshold level.

5. A method to sustain higher bandwidth in a memory system by reducing throttling of memory requests, comprising:
  estimating a first power dissipation of a memory read request and a second power dissipation of a memory write request;
  assigning a first weight to the memory read request proportional to the first power dissipation and a second weight to the memory write request proportional to the second power dissipation;
  adjusting a counter value by a first amount responsive to the first weight when the memory read request is directed to one of a plurality of memory modules in the memory system;
  adjusting the counter value by a second amount responsive to the second weight when the memory write request is directed to the one of a plurality of memory modules in the memory system; and
  throttling the memory requests to the one of a plurality of memory modules responsive to the counter value independent of throttling which may be occurring to another of the plurality of memory modules in the memory system.

6. The method of claim 5, wherein throttling the memory requests comprises throttling the memory requests to all of the memory modules.

7. The method of claim 5, wherein throttling the memory requests comprises throttling the memory requests to some of the memory modules.

8. The method of claim 5, wherein throttling the memory requests comprises tracking, over a global sample window, a number of memory read requests, a number of memory write requests, and a number of memory activate requests received by the one of the memory modules.

9. The method of claim 8, wherein the first amount and the second amount are the same.

10. The method of claim 5, further comprising:
  estimating a third power dissipation of a memory activate request;
  assigning a third weight to the memory activate request proportional to the third power dissipation; and
  adjusting the counter value by a third amount responsive to the third weight when the memory activate request is directed to the one of the plurality of memory modules in the memory system.

11. The method of claim 10, wherein throttling the memory requests comprises:
  tracking, over a first monitor period, a number of memory read requests, a number of memory write requests, and a number of memory activate requests received by the one of the memory modules;
  throttling the memory requests over a throttle period when the counter value exceeds a first threshold level;
  tracking, over a second monitor period, the number of memory read requests, the number of memory write requests, and the number of memory activate requests received by the one of the memory modules; and
  for a remainder of the second monitor period, preventing any additional memory read requests, any additional memory write requests, and any additional memory activate requests from reaching the one of the memory modules if the counter value exceeds a second threshold level.

12. A method comprising:
  during a first time period, adjusting a first value when a read request, a write request, or an activate request is directed at a first memory module;
  during the first time period, adjusting a second value when a read request, a write request, or an activate request is directed at a second memory module;
  throttling the first memory module for a second time period when the value stored in the first counter reaches a first threshold level;
  during a third time period, adjusting the first value when a read request, a write request, or an activate request is directed at the first memory module, the third time period being no greater than the second time period; and
  for a remainder of the third time period, preventing a read request, a write request, or an activate request from being sent to the first memory module when the first value reaches a second threshold level,
  wherein adjusting the first value comprises changing a value stored in a first counter, and wherein adjusting the second value comprises changing a value stored in a second counter.

13. The method of claim 12, further comprising:
  determining if the second time period has elapsed;
  when the second time period has elapsed, adjusting the first value and the second value, respectively, when a read request, a write request, or an activate request is directed at the first memory module and the second memory module during a fourth time period, the fourth time period being equal to the first time period; and
  when the second time period has not elapsed, adjusting the first value when a read request, a write request, or an activate request is directed at the first memory module during a fifth time period, the fifth time period being equal to the third time period, and, for a remainder of the fifth time period, preventing a read request, a write request, or an activate request from being sent to the first memory module when the first value reaches a third threshold level.

14. A system comprising;
  a host comprising at least one counter, the host being configured to estimate a first power dissipation of a memory read request and a second power dissipation of a memory write request, to assign a first weight to the memory read request proportional to the first power dissipation and a second weight to the memory write request proportional to the second power dissipation, and to adjust the at least one counter by a first amount responsive to the first weight and a second amount responsive to the second weight; and a memory channel coupled to the host, the memory channel including memory modules, the at least one counter corresponding to one of the memory modules, the host being configured to throttle the memory requests to one of the memory modules responsive to the at least one counter independent of throttling which may be occurring to another of the memory modules.

15. The system of claim 14, wherein the host additionally comprises a processor.

16. The system of claim 15, wherein the processor comprises a memory controller.

17. The system of claim 14, further comprising a processor that is separate from the host.

18. The system of claim 17, wherein the processor comprises a memory controller.

19. The system of claim 14, the host configured to place the memory channel in a thermal throttling mode when a value of the at least one counter reaches a threshold level.

20. The system of claim 14, the host configured to place the one of the memory modules in a thermal throttling mode when a value of the at least one counter reaches a threshold level.

21. The system of claim 14 wherein the host is configured to estimate a third power dissipation of a memory activate request, to assign a third weight to the memory activate request proportional to the third power dissipation, and to adjust the at least one counter by a third amount responsive to the third weight.

22. The system of claim 21, each of the memory modules chosen from the group consisting of a dual inline memory module (DIMM) and a single inline memory module (SIMM).

23. The system of claim 22, each of the memory modules comprising a plurality of dynamic random access memory devices (DRAMs).

24. The system of claim 14, wherein the host is configured to separately place each memory module in a thermal throttling mode whenever the value of the at least one counter reaches a threshold level.

* * * * *

UNITED STATES PATENT AND TRADEMARK OFFICE
CERTIFICATE OF CORRECTION

PATENT NO.         : 7,318,130 B2
APPLICATION NO.    : 10/881727
DATED              : January 8, 2008
INVENTOR(S)        : Morrow et al.

Page 1 of 1

It is certified that error appears in the above-identified patent and that said Letters Patent is hereby corrected as shown below:

Column 7, line 17, change "active te request" to --activate request--;

Column 8, line 63, change "comprising;" to --comprising:--.

Signed and Sealed this

Thirteenth Day of October, 2009

David J. Kappos
*Director of the United States Patent and Trademark Office*